United States Patent
Luettgen et al.

(10) Patent No.: US 6,683,250 B2
(45) Date of Patent: Jan. 27, 2004

(54) PROTECTED ELECTRONIC ASSEMBLY

(75) Inventors: Michael John Luettgen, Bloomfield Hills, MI (US); Susan Marie Degrood, Wixom, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 3 days.

(21) Appl. No.: 09/915,098

(22) Filed: Jul. 25, 2001

(65) Prior Publication Data

US 2003/0019647 A1 Jan. 30, 2003

(51) Int. Cl.$^7$ .............................. H01L 23/02; H05K 1/00
(52) U.S. Cl. ................... 174/52.4; 174/50.52; 206/706; 361/736
(58) Field of Search .................. 174/52.4, 50.52, 174/50.54, 52.1, 52.3, 59, 65 R; 361/728, 730, 736, 739, 752, 757; 206/701, 706

(56) References Cited

U.S. PATENT DOCUMENTS

| | | | |
|---|---|---|---|
| 3,226,463 A | 12/1965 | Wallace | 264/272 |
| 4,944,908 A | 7/1990 | Leveque et al. | 264/232 |
| 5,319,522 A | 6/1994 | Mehta | 361/748 |
| 5,324,888 A | * 6/1994 | Tyler et al. | 174/52.2 |
| 5,362,679 A | 11/1994 | Wakefield | 437/206 |
| 5,527,743 A | 6/1996 | Variot | 437/216 |
| 6,007,317 A | 12/1999 | Mess | 425/125 |
| 6,110,576 A | * 8/2000 | Decker et al. | 174/257 |

* cited by examiner

*Primary Examiner*—Dean A. Reichard
*Assistant Examiner*—Adolfo Nino
(74) *Attorney, Agent, or Firm*—Brinks Hofer Gilson & Lione

(57) ABSTRACT

A protected electronic assembly is provided that includes an electronic device, an outer shell, and an inner layer. The outer shell is preferably made from a rigid polymeric material, located over the electronic device, and adapted to protect the electronic device from an environment. The inner layer is preferably made from a resilient polymeric material, located between the electronic device and the outer shell, and adapted to cushion the electronic device from mechanical shock. A method of making the protected electronic assembly is also provided that includes providing an electronic device, disposing a resilient polymeric material as an inner layer around the electronic device to cushion the electronic device, and injection molding a rigid polymeric material as an outer shell around the resilient polymeric material to protect the electronic device.

10 Claims, 2 Drawing Sheets

PROTECTED ELECTRONIC ASSEMBLY

TECHNICAL FIELD

This invention relates generally to the protected electronic assembly field, and more specifically to an improved protected electronic assembly including an electronic device, an outer shell, and an inner layer.

BACKGROUND

The Mehta patent (U.S. Pat. No. 5,319,522), which is hereby incorporated in its entirety by this reference, discusses a method of encapsulating an electronic circuit board with a heat-shrinkable material and injection molding a polymeric material over the heat-shrinkable material. The heat-shrinkable material protects the electronic circuit board from thermal damage during the injection molding process. As electronic circuit boards become smaller and more complex, however, the need to protect the electronic circuit board from thermal damage becomes greater and more challenging. Thus, there is a need to create an improved protected electronic assembly and to create an improved method of making a protected electronic assembly. This invention provides such protected electronic assembly and such method.

DETAILED DESCRIPTION OF THE PREFERRED EMBODIMENT

The following description of the preferred embodiment of the invention is not intended to limit the scope of this invention to this preferred embodiment, but rather to enable any person skilled in the art of protected electronic assemblies to make and use this invention.

Figure 1:
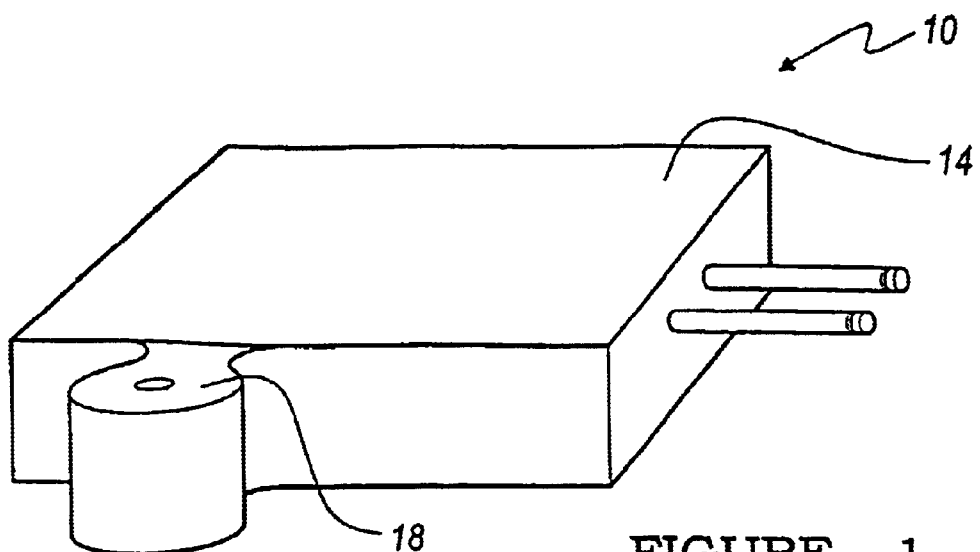
FIG. 1 is a perspective view of the protected electronic assembly of the preferred embodiment.
Figure 2:
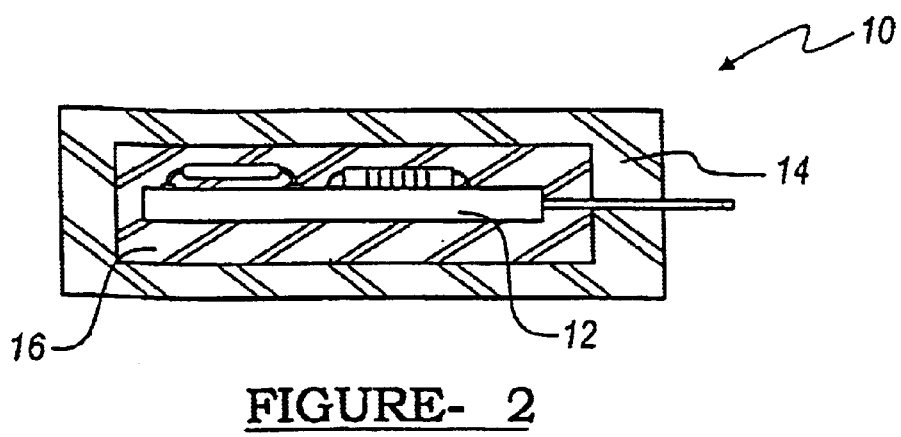
FIG. 2 is a cross-sectional view, taken along the line 1—1 of FIG. 1, of the protected electronic assembly of the preferred embodiment.

As shown in FIGS. 1 and 2, the protected electronic assembly 10 of the preferred embodiment includes an electronic device 12, an outer shell 14, and an inner layer 16. The outer shell 14, which preferably functions to protect the electronic device 12 from an environment, is preferably made from a rigid polymeric material and is preferably located over the electronic device 12. The inner layer 16, which preferably functions to cushion the electronic device 12 from mechanical shock, is preferably made from a resilient polymeric material and is preferably located between the electronic device 12 and the outer shell 14.

In the preferred embodiment, the protected electronic assembly 10 also includes an integral connector 18, which functions to allow connection of the protected electronic assembly 10 to a surface of another object (not shown). The integral connector 18 is preferably shaped with a bore, which allows a threaded member to be inserted and fastened to a surface of another object. In this manner, the protected electronic assembly 10 may be mounted within a larger system. The integral connector 18 may alternatively have any suitable shape that allows a connection to a surface of another object. The integral connector 18 is preferably formed during an injection molding process, as later discussed. In alternative embodiments, the protected electronic assembly 10 may omit the integral connector 18 or may include another suitable device or method to allow connection to a surface of another object.

Figure 3:
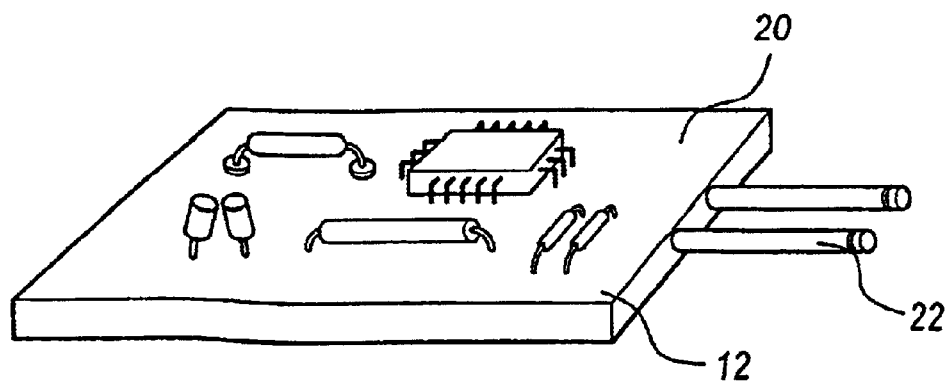
FIG. 3 is a perspective field of the electronic device of the protected electronic assembly of the preferred embodiment.

As shown in FIG. 3, electronic device 12 of the preferred embodiment is preferably an electronic circuit board 20, which preferably functions to condition an electronic signal. The electronic device 12, however, may alternatively be any suitable device that needs the mechanical and thermal shock protection afforded by the outer shell and the inner layer, as later described. Although the electronic circuit board 20 preferably has a generally planar shape, the electronic circuit board 20 may alternatively have any suitable shape. In the preferred embodiment, the protected electronic assembly 10 also includes at least one electrical lead 22 connected to the electronic circuit board 20. The electrical lead 22, which preferably functions to connect the electronic circuit board 20 to another device of a larger system, preferably extends through the inner layer and the outer shell. In alternative embodiments, the protected electronic assembly 10 may be connected to another device of a larger system by any suitable device or method, such as an optical lead or a RF transmitter. The electronic device 12 is preferably made from conventional materials and with conventional methods, but may alternatively be made from any suitable material and with any suitable method.

As shown in FIG. 2, the inner layer 16 preferably functions to cushion the electronic device 12 from mechanical shock and, for this reason, the inner layer 16 is preferably made from a resilient polymeric material and is preferably formed completely around the electronic device 112. The inner layer 16 is preferably selected from a group consisting of silicone, thermoplastic polyester ("TPE"), and thermoplastic polyolefin ("TPO"). The inner layer 16 may alternatively be made from a resilient polymeric material selected from other suitable materials. Further, the inner layer 16 may alternatively be formed partially around the electronic device 12 so long as the inner layer 16 cushions the electronic device 12 from mechanical shock.

The outer shell 14 preferably functions to protect the electronic device 12 from an environment, such as an engine compartment of a motor vehicle. In this environment, the electronic device 12 would otherwise be subjected to heat, oil, water, and other contaminants, if not protected by the outer shell 14. The outer shell 14, of course, may also protect the electronic device 12 from other environments, such as the interior compartment of a computer system, or the exterior surface of a watercraft or aircraft. The outer shell 14 is preferably made from a rigid polymeric material and is preferably formed completely around the inner layer 16. The outer shell 14 is preferably selected from a group consisting of acrylonitrile ("Nylon"), acrylonitrile butadiene styrene ("ABS"), polypropylene ("PP"), and polybutylene terephthalate ("PBT"). The outer shell 14 may alternatively be made from a rigid polymeric material selected from other suitable materials.

Because the electronic device 12 typically has a different coefficient of thermal expansion than the outer shell 14, the inner layer 16 also preferably functions to protect the electronic device 12 from expansion and contraction of the outer shell 14 during thermal shock. The inner layer 16 preferably accomplishes this feature by its resiliency.

Figure 4:
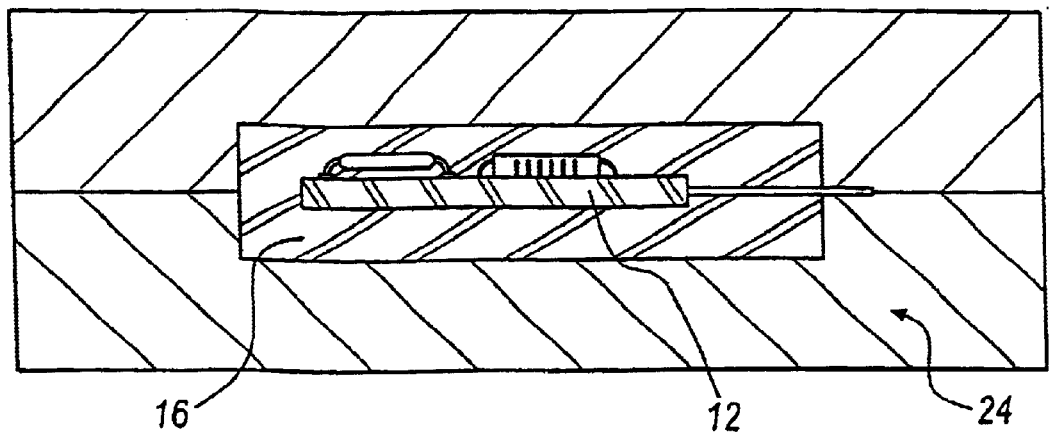
FIG. 4 is a cross-sectional view of the injection molding machine used in the preferred method of making the protected electronic assembly of the preferred embodiment, shown with the electronic device and the inner layer.
Figure 5:
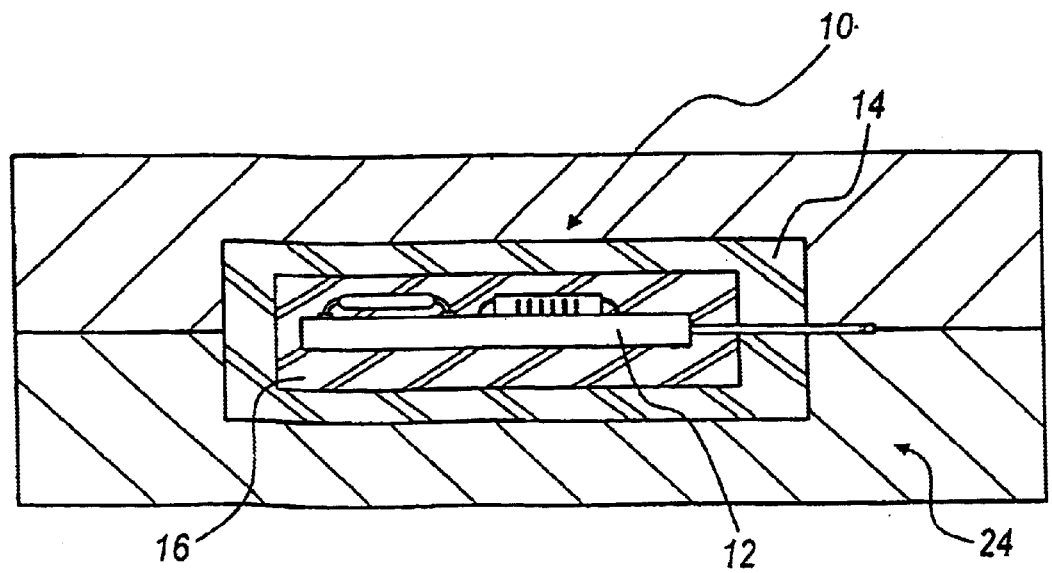
FIG. 5 is a cross-sectional view of the injection molding machine use in the preferred method of making the protected electronic assembly of the preferred embodiment, shown with the electronic device, the inner layer, and the outer shell.

The method of making the protected electronic assembly 10 preferably includes disposing the resilient polymeric material as the inner layer 16 around the electronic device 12. Although the resilient polymeric material may be coated onto the electronic device 12, the resilient polymeric material of the inner layer 16 is preferably injection molded over the electronic device 12, as shown in FIG. 4. To accomplish this act, the electronic device 12 is preferably positioned within an injection-molding machine 24 and the resilient polymeric material is preferably heated to a suitable temperature and injected through a first nozzle (not shown). The method also includes injection molding the rigid polymeric material of the outer shell 14 over the inner layer 16, as shown in FIG. 5. To accomplish this act, the electronic device 12 (with the inner layer 16) is preferably positioned within a second station of the injection-molding machine 24 and the rigid polymeric material is preferably heated to a suitable temperature and injected through a second nozzle (not shown). The method, of course, may include other suitable acts, such as cooling the inner layer 16, cooling the outer shell 14, and removing the protected electronic assembly 10. Further, the resilient polymeric material and the rigid polymeric material may alternatively be co-injected by a twin nozzle (not shown).

As any person skilled in the art of protected electronic assemblies will recognize from the previous detailed description and from the figures and claims, modifications and changes can be made to the preferred embodiment of the invention without departing from the scope of this invention defined in the following claims.

We claim:

1. A protected electronic assembly of a system comprising:

an electronic device;

an outer shell made from a rigid polymeric material, located over said electronic device, and adapted to protect said electronic device from an environment, wherein said outer shell defines an integral connector that facilitates insertion of a fastener through said outer shell to the system; and an inner layer made from a resilient polymeric material, located between said electronic device and said outer shell, and adapted to cushion said electronic device from mechanical shock.

2. The protected electronic assembly of claim 1 wherein said electronic device is an electronic circuit board.

3. The protected electronic assembly of claim 2 wherein said electronic circuit board has a generally planar shape.

4. The protected electronic assembly of claim 2 further comprising at least one electrical lead connected to said electronic circuit board and extending through said inner layer and said outer shell.

5. The protected electronic assembly of claim 1 wherein said outer shell is made from a rigid polymeric material selected from a group consisting of nylon, acrylonitrile butadiene styrene, polypropylene, and polybutylene terephthalate.

6. The protected electronic assembly of claim 1 wherein said inner layer is made from a resilient polymeric material selected from a group consisting of silicone, thermoplastic polyester, and thermoplastic polyolefin.

7. The protected electronic assembly of claim 6 wherein said inner layer is also adapted to provide protection of said electronic device during expansion and contraction of said outer shell.

8. An protected electronic assembly of a system comprising:

an electronic circuit board having a generally planar shape;

an outer shell made from a rigid polymeric material, located over said electronic device, and adapted to protect said electronic device from an environment, wherein said outer shell defines an integral connector that facilitates insertion of a fastener through said outer shell to the system;

an inner layer made from a resilient polymeric material, located between said electronic device, and said outer shell and adapted to cushion said electronic device from mechanical shock and to provide protection of said electronic device during expansion and contraction of said outer shell; and an electrical lead connected to said electronic circuit board and extending through said inner layer and said outer shell.

9. The protected electronic assembly of claim 8 wherein said outer shell is made from a rigid polymeric material selected from a group consisting of nylon, acrylonitrile butadiene styrene, polypropylene, and polybutylene terephthalate.

10. The protected electronic assembly of claim 9 wherein said inner layer is made from a resilient polymeric material selected from a group consisting of silicone, thermoplastic polyester, and thermoplastic polyolefin.

* * * * *